United States Patent
Irving

(10) Patent No.: US 9,316,914 B2
(45) Date of Patent: *Apr. 19, 2016

(54) ELECTROLESS PLATING METHOD USING NON-REDUCING AGENT

(71) Applicant: Eastman Kodak Company, Rochester, NY (US)

(72) Inventor: Mark Edward Irving, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 148 days.

This patent is subject to a terminal disclaimer.

(21) Appl. No.: 14/085,030

(22) Filed: Nov. 20, 2013

(65) Prior Publication Data

US 2015/0140496 A1    May 21, 2015

(51) Int. Cl.
| | |
|---|---|
| *G03F 7/26* | (2006.01) |
| *G03F 7/16* | (2006.01) |
| *G03F 7/20* | (2006.01) |
| *G03F 7/11* | (2006.01) |

(52) U.S. Cl.
CPC .. *G03F 7/16* (2013.01); *G03F 7/11* (2013.01); *G03F 7/20* (2013.01); *Y10T 428/24802* (2015.01)

(58) Field of Classification Search
CPC .................. H01L 21/76874; H01L 21/76825
USPC ........................................................ 430/324
See application file for complete search history.

(56) References Cited

U.S. PATENT DOCUMENTS

| | | |
|---|---|---|
| 3,137,668 A | 6/1964 | Kuppers |
| 4,373,070 A | 2/1983 | Soula |
| 4,701,351 A | 10/1987 | Jackson |
| 5,928,840 A | 7/1999 | Matsuo et al. |
| 6,017,683 A | 1/2000 | Endo et al. |
| 6,379,863 B1 | 4/2002 | Oohashi et al. |
| 7,399,579 B2 | 7/2008 | Deng et al. |
| 7,739,789 B2 | 6/2010 | Kano et al. |
| 7,934,966 B2 | 5/2011 | Sasaki et al. |
| 8,012,676 B2 | 9/2011 | Yoshiki et al. |
| 2007/0246249 A1 | 10/2007 | Kano et al. |

FOREIGN PATENT DOCUMENTS

EP    0 773 478 A1    5/1997

OTHER PUBLICATIONS

Joanna Aizenberg, et al., "Patterned Colloidal Deposition Controlled by Electrostatic and Capillary Forces," Physical Review Letters, vol. 84, No. 13, Mar. 27, 2000, 2997-3000.

Masamitsu Shirai, et al., "Photo-assisted thermal crosslinking of polymers having imino sulfonate units," Reactive & Functional Polymers 37 (1998) 147-154.

Yuval Ofir, et al., "Polyelectrolyte Negative Resist Patterns as Templates for the electrostatic Assembly of Nanoparticles and Electroless Deposition of Metallic Films," Advanced Materials, 2008, 20, 2561-2566.

Masamitsu Shirai, et al., "Novel Photocrosslinkable Polymers with Pendant Imino Sulfonate Groups," Journal of Polymer Science: Part C: Polymer Letters, vol. 24, 119-134 (1986).

Masamitsu Shirai, et al. "Polysiloxane Formation at the Irradiated surface of Polymers Containing Both Photoacid Generating Units and Epoxy Units," Eur. Polym. J. vol. 33, No. 8, pp. 1255-1262, 1997.

Masamitsu Shirai, et al., "Surface Imaging Using Photoinduced Acid-Catalyzed Formation of Polysiloxanes at Air-Polymer Interface," American Chemical Society, 1994, Chapter 15, pp. 185-200.

Masamitsu Shirai, et al., "Photoinduced Acid-Catalyzed SiO2 Formation at the Polymer Surface by Chemical Vapor Deposition," Macromolecules 1992, 25, 195-200.

*Primary Examiner* — Daborah Chacko Davis
(74) *Attorney, Agent, or Firm* — J. Lanny Tucker

(57) ABSTRACT

A conductive metal pattern can be formed in a polymeric layer that has a reactive polymer that comprises (1) pendant groups that are capable of providing pendant sulfonic acid groups upon exposure, and (2) pendant groups that are capable of reacting in the presence of the sulfonic acid groups to provide crosslinking. The polymeric layer is patternwise exposed to provide non-exposed regions and exposed regions comprising a polymer comprising pendant sulfonic acid groups. The exposed regions are contacted with electroless seed metal ions to form a pattern of electroless seed metal ions. This pattern can be contacted with a non-reducing reagent that reacts with the electroless seed metal ions to form an electroless seed metal compound that has a $pK_{sp}$ of less than 40, and which is electrolessly plated with a conductive metal.

17 Claims, No Drawings

ELECTROLESS PLATING METHOD USING NON-REDUCING AGENT

RELATED APPLICATIONS

Reference is made to the following related applications:

Copending and commonly assigned U.S. Ser. No. 14/084,675 filed on Nov. 20, 2013, by Wexler, Bennett, and Lindner and entitled "Crosslinkable Reactive Polymers."

Copending and commonly assigned U.S. Ser. No. 14/084,693 filed on Nov. 20, 2013, by Irving, Wexler, Bennett, and Lindner and entitled "Forming Conductive Metal Pattern Using Reactive Polymers."

Copending and commonly assigned U.S. Ser. No. 14/084,711 filed on Nov. 20, 2013, by Wexler, Bennett, and Lindner, and entitled "Forming Patterns Using Crosslinkable Reactive Polymers."

Copending and commonly assigned U.S. Ser. No. 14/084,732 filed on Nov. 20, 2013, by Irving and entitled "Electroless Plating Method."

Copending and commonly assigned U.S. Ser. No. 14/084,755 filed on Nov. 20, 2013, by Irving and entitled "Electroless Plating Method Using Bleaching."

Copending and commonly assigned U.S. Ser. No. 14/084,969 filed on Nov. 20, 2013, by Irving and entitled "Electroless Plating Method Using Halide."

FIELD OF THE INVENTION

This invention relates to methods for forming metallic patterns, for example using electroless plating, using reactive polymers that can be crosslinked upon suitable irradiation.

BACKGROUND OF THE INVENTION

In recent decades accompanying rapid advances in information-oriented society, there have also been rapid technological advances to provide devices and systems for gathering and communicating information. Of these, display devices have been designed for television screens, commercial signage, personal and laptop computers, personal display devices, and phones of all types, to name the most common information sharing devices.

As the increase in the use of such devices has exploded in frequency and necessity by displacing older technologies, there has been a concern that electromagnetic radiation emission from such devices may cause harm to the human body or neighboring devices or instruments over time. To diminish the potential effects from the electromagnetic radiation emission, display devices are designed with various transparent conductive materials that can be used as electromagnetic wave shielding materials.

In display devices where a continuous conductive film is not practical for providing this protection from electromagnetic radiation emission, it has been found that conductive mesh or patterns can be used for this electromagnetic wave shielding purpose for example as described in U.S. Pat. No. 7,934,966 (Sasaki et al.).

Other technologies have been developed to provide new microfabrication methods to provide metallic, two-dimensional, and three-dimensional structures with conductive metals. Patterns have been provided for these purposes using photolithography and imaging through mask materials as described for example in U.S. Pat. No. 7,399,579 (Deng et al.).

Improvements have been proposed for providing conductive patterns using photosensitive silver salt compositions such as silver halide emulsions as described for example in U.S. Pat. No. 8,012,676 (Yoshiki et al.). Such techniques have a number of disadvantages that are described in this patent and the efforts continue to make additional improvements.

In addition, as the noted display devices have developed in recent years, their attraction has increased greatly with the use of touch screen technology whereby a light touch on the screen surface with a finger or stylus can create signals to cause changes in screen views or cause the reception or sending of information, telecommunications, interaction with the internet, and many other features that are being developed at an ever-increasing pace of innovation. The touch screen technology has been made possible largely by the use of transparent conductive grids on the primary display so that the location of the noted touch on the screen surface can be detected by appropriate electrical circuitry and software.

For a number of years, touch screen displays have been prepared using indium tin oxide (ITO) coatings to create arrays of capacitive patterns or areas used to distinguish multiple point contacts. ITO can be readily patterned using known semiconductor fabrication methods including photolithography and high vacuum processing. However, the use of ITO coatings has a number of disadvantages. Indium is an expensive rare earth metal and is available in limited supply. Moreover, ITO is a ceramic material and is not easily bent or flexed and such coatings require expensive vacuum deposition methods and equipment. In addition, ITO conductivity is relatively low, requiring short line lengths to achieve desired response rates (upon touch). Touch screens used in large displays are broken up into smaller segments in order to reduce the conductive line length to an acceptable electrical resistance. These smaller segments require additional driving and sensing electronics, further adding to the cost of the devices.

Silver is an ideal conductor having conductivity that is 50 to 100 times greater than that of ITO. Unlike most metal oxides, silver oxide is still reasonably conductive and its use reduces the problem of making reliable electrical connections. Moreover, silver is used in many commercial applications and is available from numerous commercial sources.

In other technologies, transparent polymeric films have been treated with conductive metals such as silver, copper, nickel, and indium by such methods as sputtering, ion plating, ion beam assist, wet coating, as well as the vacuum deposition. However, all of these technologies are expensive, tedious, or extremely complicated so that the relevant industries are spending considerable resources to design improved means for forming conductive patterns for various devices especially touch screen displays.

A similar level of transparency and conductivity for patterns can be achieved by producing very fine lines of about 5-6 μm in width of highly conductive material such as copper or silver metal or conductive polymers. There is a need for a way to make these thin conductive lines with less expensive materials and plating techniques in order to achieve a substantial improvement in cost, reliability, and availability of conductive patterns for various devices. The present invention addresses this need as described in considerable detail below.

SUMMARY OF THE INVENTION

The present invention provides a method for using the reactive polymers described herein to address some of the noted problems.

A method for forming a pattern in a polymeric layer, the method comprising:

providing a polymeric layer comprising a reactive composition that comprises a reactive polymer that comprises (1) pendant groups that are capable of providing pendant sulfonic acid groups upon exposure of the reactive polymer to radiation having a $\lambda_{max}$ of at least 150 nm and up to and including 450 nm, and (2) pendant groups that are capable of reacting in the presence of the sulfonic acid groups to provide crosslinking in the reactive polymer, patternwise exposing the polymeric layer to radiation having a $\lambda_{max}$ of at least 150 nm and up to and including 450 nm, to provide a polymeric layer comprising non-exposed regions and exposed regions comprising a polymer comprising sulfonic acid groups, contacting the exposed regions of the polymeric layer with electroless seed metal ions to form a pattern of electroless seed metal ions in the exposed regions of the polymeric layer, optionally contacting the electroless seed metal ions in the exposed regions of the polymeric layer with a non-reducing reagent that reacts with the electroless seed metal ions to form an electroless seed metal compound that has a $pK_{sp}$ of less than 40, and electrolessly plating the bound metal electroless seed metal compound in the exposed regions of the polymeric layer with a metal that is the same as or different from the metal within the bound electroless seed metal compound.

The present invention can also provide an intermediate article comprising a substrate and having disposed thereon a polymeric layer comprising exposed regions and non-exposed regions, the exposed regions comprising a pattern of an electroless seed metal compound comprising a non-reducing reagent in a de-blocked and crosslinked polymer derived from a reactive polymer that comprises (1) pendant groups that are capable of providing pendant sulfonic acid groups upon exposure of the reactive polymer to radiation having a $\lambda_{max}$ of at least 150 nm and up to and including 450 nm, and (2) pendant groups that are capable of reacting in the presence of the sulfonic acid groups to provide crosslinking in the reactive polymer, the electroless seed metal compound having a $pK_{sp}$ of less than 40, and the non-exposed regions comprising a reactive composition that comprises the reactive polymer that comprises (1) pendant groups that are capable of providing pendant sulfonic acid groups upon exposure of the reactive polymer to radiation having a $\lambda_{max}$ of at least 150 nm and up to and including 450 nm, and (2) pendant groups that are capable of reacting in the presence of the sulfonic acid groups to provide crosslinking in the reactive polymer.

The present invention provides an efficient method for forming conductive metal patterns using a specifically designed reactive polymer that can be de-blocked and crosslinked for pattern formation. The reactive polymer can undergo one or more chemical reactions upon irradiation to provide pendant sulfonic acid groups and to provide sites that promote polymer crosslinking in the reactive composition as well as reactive sites that will complex with catalytic metal ions such as silver ions or palladium ions. The chemical reactions also increase the hydrophilicity of exposed regions to allow diffusion of hydrophilic compounds such as aqueous metal ions, dyes, and non-reducing reagents and to promote strong adhesion of the polymeric layer to a substrate using crosslinking to minimize dissolution in various aqueous-based baths, solutions, or dispersions used in electroless plating methods.

The necessary pendant sulfonic acid groups are generated in the reactive polymer during exposure for example to ultraviolet light. The pendant sulfonic acid groups increase the hydrophilicity of the resulting de-blocked and crosslinked polymer and are available to complex or react with metal ions or other charged molecules.

The present invention avoids the use of known expensive high vacuum processes necessary for making conductive patterns using indium tin oxide (ITO) coatings and is more readily carried out using high-speed roll-to-roll machines to provide higher manufacturing efficiencies.

DETAILED DESCRIPTION OF THE INVENTION

Definitions

As used herein to define various ethylenically unsaturated polymerizable monomer components (or recurring units) of the reactive polymers, solutions, reactive compositions, aqueous-based solutions, and polymeric layers, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Unless otherwise indicated, the term "weight %" refers to the amount of a component or material based on the total solids of a composition, formulation, or layer. Unless otherwise indicated, the percentages can be the same for either a dry layer or pattern, or for the total solids of the formulation or composition.

The term "homopolymer" is meant to refer to polymeric materials that have the same repeating or recurring unit along a reactive polymer backbone. The term "copolymer" refers to polymeric materials composed of two or more different repeating or recurring units that are arranged randomly along the reactive polymer backbone.

For reactive polymers used in the present invention, the term "arranged randomly" means that blocks of recurring units are not intentionally incorporated into the reactive polymers, but that recurring units are incorporated into the backbone in a random fashion using known polymerization procedures that do not encourage the formation of block copolymers.

Recurring units in reactive polymers described herein are generally derived from the corresponding ethylenically unsaturated polymerizable monomers used in a polymerization process, which ethylenically unsaturated polymerizable monomers have the desired pendant groups. Alternatively, pendant groups can be modified within recurring units after polymerization of ethylenically unsaturated polymerizable monomers having requisite precursor pending groups.

The term "reactive polymer" is used herein to refer to the polymers described below that comprise at least one pendant labile group that can be changed, such as de-blocked (or unblocked), during appropriate irradiation to provide pendant sulfonic acid groups, and further comprise groups that can provide crosslinking in the presence of the unblocked pendant sulfonic acid groups.

The term "aqueous-based" refers to solutions, baths, or dispersions in which the predominant solvent, or at least 50 weight % of the solvents, is water.

Unless otherwise indicated, the term "mol %" when used in reference to recurring units in reactive polymers, refers to either the nominal (theoretical) amount of a recurring unit based on the amount of ethylenically unsaturated polymerizable monomer used in the polymerization process, or to the actual amount of recurring unit in the resulting reactive polymer.

Reactive Polymers for Pattern Formation

In general, the reactive polymers useful in the practice of this invention two essential features: (1) they have labile groups that upon exposure to suitable radiation are deblocked and provide pendant sulfonic acid groups, and (2) upon such irradiation, they are capable of being de-blocked and crosslinked only in exposed regions. While the reactive polymers can be supplied in reactive compositions as solutions in appropriate solvents, they are best used when applied to a substrate that can be a large or small surface, including the outer surfaces of inorganic or organic particles and then dried.

The reactive polymers can be either condensation or vinyl polymers as long as the requisite pendant groups are connected to the polymer backbone. In most embodiments, the useful reactive polymers are vinyl polymers derived from one or more ethylenically unsaturated polymerizable monomers using solution or emulsion polymerization techniques and conditions, initiators, surfactants, catalysts, and solvents, all of which would be readily apparent to one skilled in the art from the teaching provided herein.

The useful reactive polymers generally comprise at least some recurring units that comprise pendant groups attached to the polymer backbone, which pendant groups comprise a labile sulfonic acid. The term "labile" means that the labile sulfonic acid groups can provide pendant sulfonic acid groups (such as aromatic sulfonic acid groups) upon de-blocking when the reactive polymer is exposed to radiation having a $\lambda_{max}$ of at least 150 nm and up to and including 450 nm, or more likely exposed to radiation having a $\lambda_{max}$ of at least 150 nm and up to and including 330 nm (sometimes known as "short UV"). Prior to the noted irradiation, the labile sulfonic acid groups are considered "blocked" and are not available for reaction or causing reaction.

The reactive polymers become de-blocked and crosslinked during the noted irradiation and generation of the pendant sulfonic acid groups. In many embodiments, such crosslinking can be provided with distinct pendant acid-crosslinkable groups that are incorporated randomly along the reactive polymer backbone. Crosslinking further can be provided using distinct compounds that are dispersed as crosslinking agents within the polymeric layer (described below) comprising one or more reactive polymers.

Once suitable pendant sulfonic acid groups are generated upon irradiation, the resulting polymer can be either water-soluble or water-insoluble in irradiated or exposed regions of the polymeric layer, depending upon the extent of crosslinking in the resulting polymeric layer.

Particularly useful reactive polymers used in the present invention can be represented by the following -A-, -B-, and optional -C- recurring units in random order along the polymer backbone.

In particular, the -A- recurring units are derived from any ethylenically unsaturated polymerizable monomer having appropriate pendant aromatic groups that are capable of providing pendant aromatic sulfonic acid groups from aromatic sulfonic acid oxime ester groups having a cleavable —S(=O)$_2$—O—N=C< moiety (for example a "blocking groups"). The sulfur atom of this moiety is typically connected to a carbocyclic aromatic group that is in turn attached to the polymer backbone, and the nitrogen atom of the moiety can have linear or branch substituents.

The -B- recurring units can be derived from any ethylenically unsaturated polymerizable monomer that has pendant groups that can provide sulfonic acid-catalyzed crosslinking in the irradiated polymer. Such pendant groups are well known in the art and some useful examples are described below.

More particularly, the -A-, -B-, and -C- recurring units can be represented as follows:

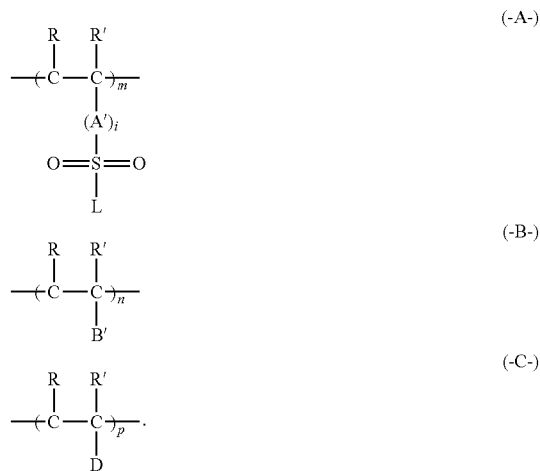

In these formulae, the -A- recurring units comprise blocked (labile) pendant aromatic sulfonic acid oxime ester groups that are capable of providing pendant aromatic sulfonic acid groups upon irradiation from exposing radiation having a $\lambda_{max}$ (maximum wavelength) of at least 150 nm and up to and including 450 nm (or a $\lambda_{max}$ of at least 150 nm and up to and including 250 nm).

Within the -A- recurring units, the moiety identified as A' can represent a single bond (wherein "i" is 0) but A' is most likely a divalent linking group (wherein "i" is 1) such as a substituted or unsubstituted arylene group including but not limited to a substituted or unsubstituted phenylene or naphthalene group. Possible substituents on the arylene group include but are not limited to alkyl groups having 1 to 3 carbon atoms and any other group that would be readily apparent to a skilled worker in the art to not interfere with removal of the L blocking group and such groups can be in any suitable position on the arylene ring. Particularly useful A' groups are substituted or unsubstituted phenylene, and unsubstituted phenylene is most useful.

Moreover, "L" is a blocking group that is readily removed during irradiation of the polymer as noted above such as an oxime ester group containing a —S(=O)—O—N=C< oxime ester moiety. This moiety is readily cleaved at the O—N bond as this bond is relatively weak in the range of 40 to 60 kcal of energy to provide pendant aromatic sulfonic acid groups in the resulting reacted and crosslinked polymer. The carbon atom in the noted oxime ester moiety can be attached to the same or different substituted or unsubstituted hydrocarbon group including but not limited to, substituted or unsubstituted alkyl (linear, branched, or cyclic) and substituted or unsubstituted aryl groups, or the carbon atom can be part of a saturated or unsaturated carbocyclic ring (including fused ring systems).

Once the blocking group has been removed from the -A- recurring units during irradiation, the -A- recurring units become "reacted -A- recurring units".

In some embodiments, the reactive polymers comprise greater than 50 mol % -A- recurring units derived from one or more ethylenically unsaturated polymerizable monomers, which recurring units can be represented by the following Structure D':

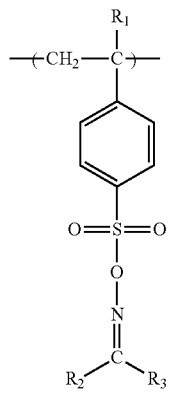
(D')

wherein R₁ represents hydrogen or an alkyl group having 1 to 3 carbon atoms, and R₂ and R₃ can be the same or different and represent hydrogen, a substituted or unsubstituted alkyl group (branched or linear and including cycloalkyl groups) having 1 to 10 carbon atoms, a substituted or unsubstituted aryl group having 6 or 10 carbon atoms in the aromatic ring, or a substituted or unsubstituted alkenyl group (branched or linear, and including cycloalkenyl groups) having 2 to 10 carbon atoms.

Alternatively, R₂ and R₃ together with the carbon atom to which they are attached can form a substituted or unsubstituted non-aromatic carbocyclic ring 5 to 14 carbon atoms in the cyclic ring (including fused rings), which cyclic ring can also have some carbon-carbon unsaturation but not to the extent to give the cyclic ring aromaticity. Such cyclic rings can be substituted, where valences allow, with one or more oxo (=O) groups, or with alkyl groups having 1 to 3 carbon atoms.

Reactive Polymer.

Particularly useful -A- recurring units comprise a cyclic oxime ester group and can be derived for example, from 1,2,3,4-tetrahydro-1,-naphthylideneamino-p-styrene-sulfonate (sometimes known in the art as "TOSS" ethylenically unsaturated polymerizable monomer).

Representative useful -A- recurring units for reactive polymers are shown as follows (the first structure showing recurring units derived from TOSS), which -A- recurring units can be derived from the corresponding ethylenically unsaturated polymerizable monomers:

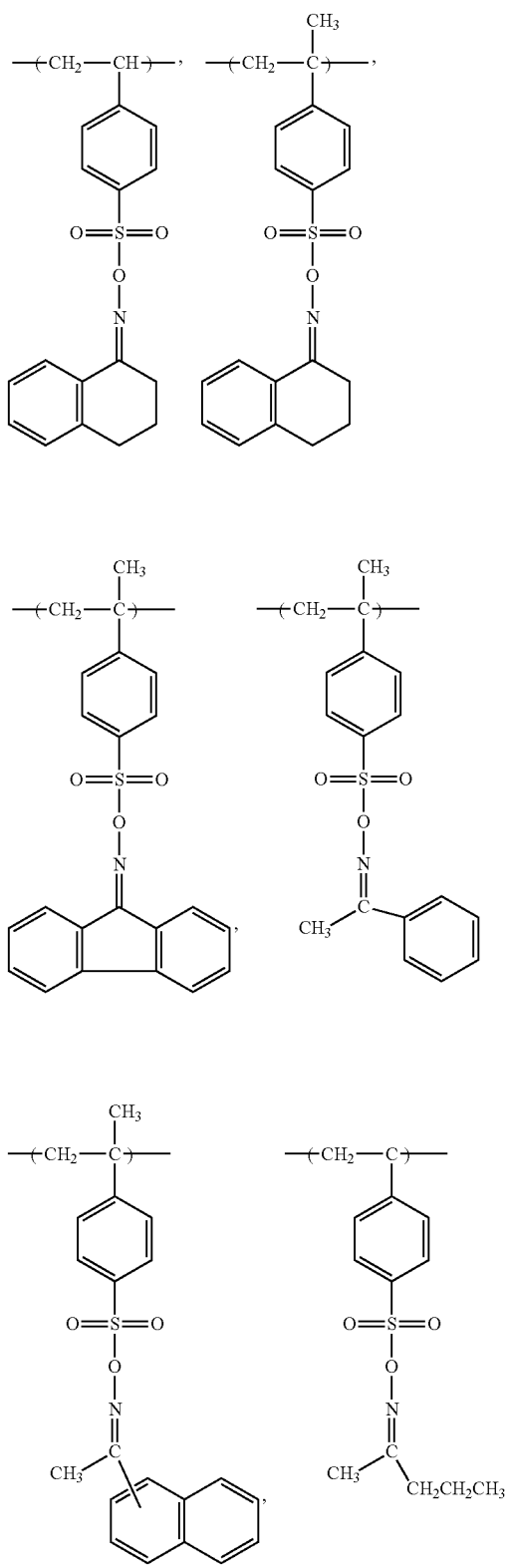

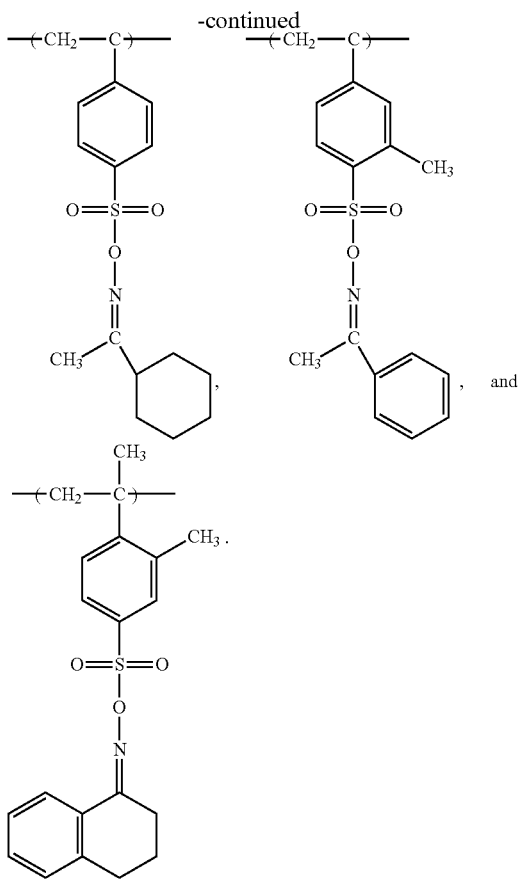

The -B- recurring units can be derived from any suitable ethylenically unsaturated polymerizable monomer, or group of monomers, having the same or different B' group that is capable of providing acid-catalyzed crosslinking when the pendant aromatic sulfonic acid groups are generated in the -A- recurring units during irradiation. For example, the -B- recurring units can comprise pendant B' groups that comprise an epoxy (such as a glycidyl group) or epithiopropyl group. Particularly useful -B- recurring units comprise pendant crosslinkable epoxy groups such as glycidyl groups and can be derived from glycidyl methacrylate or glycidyl acrylate. Other useful ethylenically unsaturated polymerizable monomers that have sulfonic acid-catalyzed crosslinking groups would be readily apparent to one skilled in the art.

Upon irradiation, the -B- recurring units can provide the crosslinking as described above, and are then considered to be "reacted -B-recurring units".

In addition to the -A- and -B- recurring units described above that are essential in the reactive polymers of this invention, the reactive polymers can further comprise one or more additional recurring units that are different from all -A- and -B- recurring units, and herein identified as -C- recurring units. A skilled polymer chemist would understand how to choose such additional recurring units, and for example, they can be derived from one or more ethylenically unsaturated polymerizable monomers selected from the group consisting of alkyl acrylates, alkyl methacrylates, (meth)acrylamides, styrene and styrene derivatives, vinyl ethers, vinyl imides, and other materials that a skilled worker in the art would understand could provide desirable properties to the reactive polymer. Thus, the D groups in the C recurring units can be for example, substituted or unsubstituted alkyl groups, substituted or unsubstituted aryl groups (such as substituted or unsubstituted phenyl groups), alkyl ester groups, aryl ester groups, or ether groups. In many useful C recurring units, the D groups are alkyl carboxyl ester groups wherein the alkyl moiety has 1 to 6 carbon atoms and is linear, branched, or cyclic in form.

In all of the -A-, -B-, and -C- recurring units, R and R' can be the same or different hydrogen, methyl, ethyl, or chloro groups and each type of recurring unit can have the same or different R and R' groups along the polymer backbone. In most embodiments, R and R' are hydrogen or methyl, and R and R' can be the same or different for the various -A-, -B-, and -C- recurring units in a given reactive polymer.

In the -A-, -B-, and -C- recurring unit formulae shown above, "m", "n", and "p" are used to represent the respective molar amounts of recurring units, based on total recurring units, in a given reactive polymer, so that the sum of m, n, and p equal 100 mol % in a given reactive polymer.

In general, m is greater than 50 mol %, or even at least 60 mol % and up to and including 98 mol %, or at least 60 mol % and up to and including 95 mol %, based on the total recurring units in the reactive polymer. In addition, n generally represents at least 2 mol % and less than 50 mol %, or more typically at least 5 mol % and up to and including 40 mol %, or even at least 5 mol % and up to and including 25 mol %, based on the total recurring units in the reactive polymer. Moreover, while p can be 0 mol %, it can be up to and including 25 mol %, or typically at least 3 mol % and up to and including 20 mol %, or at least 5 mol % and up to and including 12 mol %, based on the total recurring units in the reactive polymer.

The mol % amounts of the various recurring units defined herein for the reactive polymers of this invention are meant to refer to the actual molar amounts present in the reactive polymers. It is understood by one skilled in the art that the actual mol % values may differ from those theoretically possible from the amount of ethylenically unsaturated polymerizable monomers that are used in the polymerization procedure. However, under most polymerization conditions that allow high polymer yield and optimal reaction of all monomers, the actual mol % of each monomer is generally within ±15 mol % of the theoretical amounts.

Some representative reactive polymer embodiments include but are not limited to, the following copolymers and terpolymers (TOSS is identified above) wherein the molar ratios are theoretical (nominal) amounts based on the actual molar ratio of ethylenically unsaturated polymerizable monomers used in the polymerization process. The actual molar amounts of recurring units can differ from the theoretical (nominal) amounts of monomers if the polymerization reactions are not carried out to completion.

poly(TOSS-co-glycidyl methacrylate) (60:40);
poly(TOSS-co-glycidyl methacrylate) (80:20);
poly(TOSS-co-glycidyl methacrylate-co-n-butyl acrylate) (80:10:10);
poly(TOSS-co-glycidyl methacrylate-co-n-butyl methacrylate) (80:10:10);
poly(TOSS-co-2-phenoxyethyl acrylate) (80:20);
poly(TOSS-co-n-butyl acrylate) (80:20);
poly(TOSS-co-glycidyl methacrylate-co-n-butyl acrylate) (70:20:10); and
poly(TOSS-co-glycidyl methacrylate-co-2-phenoxyethyl acrylate) (70:20:10).

The reactive polymers generally have a molecular weight ($M_w$) of at least 30,000 and up to and including 300,000 as measured by gel permeation chromatography (GPC) or by size exclusion chromatography (SEC).

The reactive polymers can be prepared using known free radical solution polymerization techniques using known starting materials, free radical initiators, and reaction conditions in suitable organic solvents such as tetrahydrofuran that can be adapted from known polymer chemistry. Where starting materials (such as ethylenic ally unsaturated polymerizable monomers) are not available commercially, such starting materials can be synthesized using known chemical starting materials and procedures.

Representative preparations of particularly useful reactive polymers are provided below for the Invention Examples.

In general, the reactive polymers can be stored in solution in suitable solvents. Depending upon the sensitivity of the reactive polymer to light (such as room light), during and after preparation, the reactive polymers can be kept in the dark or away from light exposure until they are formulated into reactive compositions and used for various purposes. To enhance storage stability, one or more acid scavengers, such as hindered amines, can be added to the reactive polymer solution during or after polymerization. A skilled polymer chemist would know what compounds would be suitable as acid scavengers and how much to use with a particular reactive polymer and desired storage stability.

Reactive Compositions:

The reactive polymers described herein can be used in reactive compositions in various methods for forming conductive patterns in polymeric layers for example using electroless plating.

Each reactive composition has only one essential component: one or more reactive polymers as described above, each of which provides pendant sulfonic acid groups upon exposure to radiation having $\lambda_{max}$ of at least 150 nm and up to and including 450 nm, as described below, and which reactive polymer can also comprise pendant acid-crosslinkable groups so that a separate crosslinking agent or crosslinking precursor, while optional, is not necessary. While various other optional components can be included as described below, only the reactive polymer is essential for providing the desired pattern in the reactive composition forming the polymeric layer.

One or more reactive polymers as described above are generally present in the reactive composition (and in the resulting dry polymeric layer) in an amount of at least 50 weight % and up to and including 100 weight %, or typically at least 80 weight % and up to and including 95 weight %, based on the total solids in the reactive composition (or dry polymeric layer weight).

Individual compounds that provide an acid having a pKa of less than 2 (as measured in water) during the noted exposure to radiation are not necessary in most embodiments of the present invention and can be excluded from the reactive composition. However, in some embodiments, additional imaging sensitivity can be provided by incorporating onium salts that decompose upon irradiation. An onium salt (also known as an onium compound) is a compound that is formed by the attachment of a proton to a mononuclear parent hydride of a Group 15 element (for example nitrogen and phosphorus), a chalcogen of Group 16 (for example sulfur and selenium), or a halogen (such as fluorine, chlorine, and iodine). Particularly useful onium salts include but not limited to, sulfonium salts, phosphonium salts, iodonium salts, and aryldiazonium salts. In such embodiments, the sulfonium salts, phosphonium salts, and iodonium salts are particularly useful, including but not limited to the arylsulfonium salts and aryliodonium salts that can provide an acid having a pKa less than 2, or even less than 0, as measured in water.

In addition, the reactive compositions generally do not include separate crosslinking agents or crosslinking agent precursors because the reactive polymer itself includes sufficient pendant acid-crosslinkable groups. However, if desired for enhanced crosslinking, the reactive composition can include crosslinking agents that will react with pendant sulfonic acid groups or other moieties in the irradiated reactive polymer.

For example, some optional crosslinking agents include but are not limited to, melamine formaldehyde resins, glycoluril formaldehyde resins, polycarboxylic acids and anhydrides, polyamines, epihalohydrins, diepoxides, dialdehydes, diols, carboxylic acid halides, ketenes, aziridines, carbodiimides, isocyanates, and mixtures thereof. Such crosslinking agents can be present in the reactive composition in an amount of at least 1 weight % and up to and including 30 weight %, based on the total solids in the reactive composition.

While not essential, it is sometimes desirable to enhance the sensitivity of some reactive polymers to longer wavelengths (for example, greater than 300 nm) by including one or more photosensitizers in the reactive composition used in this invention. A variety of photosensitizers are known in the art such as aromatic tertiary amines, aromatic tertiary diamines and certain aromatic polycyclic compounds such as substituted or unsubstituted anthracene compounds, as described for example in U.S. Pat. No. 4,069,054 (Smith) and U.S. Pat. No. 7,537,452 (Dede et al.). Particularly useful photosensitizers include unsubstituted anthracene and substituted anthracenes such as 9,10-diethoxyanthracene and 2-t-butyl-9,10-diethoxyanthracene.

One or more photosensitizers can be optionally present in the reactive composition (and dry polymeric layer) in an amount of at least 1 weight % and up to and including 30 weight %, or more likely at least 5 weight % and up to and including 15 weight %, based on the total solids in the reactive composition (or dry polymeric layer weight).

The reactive compositions can optionally include one or more addenda such as film-forming compounds, surfactants, plasticizers, filter dyes, viscosity modifiers, high boiling solvents that are compatible with the reactive polymers (such as phthalated esters including dibutyl phthalate and dioctyl phthalate), and any other optional components that would be readily apparent to one skilled in the art, and such addenda can be present in amounts that would also be readily apparent to one skilled in the art.

The essential reactive polymer and any optional compounds described above are generally dissolved in a suitable organic solvent (or mixture of organic solvents) to form a reactive composition that can be applied to a suitable substrate (described below). Useful organic solvents include but are not limited to, cyclic ketones such as 2-butanone, cyclopentanone and cyclohexanone, substituted benzenes such as chlorobenzene and anisole, ethyl lactate, propylene glycol methyl ether acetate, or γ-butyrolactone. Various mixtures of these organic solvents can be used if desired especially to dilute more toxic organic solvents with less toxic organic solvents such as blends of cyclopentanone with any of ethyl lactate, propylene glycol methyl ether acetate, or γ-butyrolactone.

Articles

The reactive composition described above can be applied to a suitable substrate using any suitable method including but not limited to, spin coating, bead coating, blade coating, curtain coating, or spray coating, from a suitable reservoir to form a polymeric layer. Useful substrates can be chosen for particular use or method as long as the substrate material will not be degraded by the reactive composition or any treatments to which the resulting precursor articles are subjected during the methods of this invention. The reactive composition can be applied multiple times if desired to obtain a thicker coating (reactive layer) of the reactive composition, and dried between each coating or dried only after the last application. Solvent can be removed from the reactive composition using any suitable drying technique.

In general the final dry coating of reactive composition can have an average dry thickness of at least 10 nm and up to and including 10 mm, with a dry thickness of at least 0.1 µm and up to and including 100 µm being more useful. The average dry thickness can be determined by measuring the dry layer thickness in at least 10 different places within a 10 cm by 10 cm square of the dry reactive layer using an electron microscope or other suitable diagnostic device.

Thus, useful substrates can be composed of glass, quartz, and ceramics as well as a wide variety of flexible materials such as cellulosic papers and polyesters including poly(ethylene terephthalate) and poly(ethylene naphthalate), polycarbonates, polyamides, poly(meth)acrylates, and polyolefins. Useful polymeric substrates can be formed by casting or extrusion methods. Laminates of various substrate materials can also be put together to form a composite substrate. Any of the substrates can be treated to improve adhesion using for example corona discharge, oxygen plasma, ozone or chemical treatments using silane compounds such as aminopropyltriethoxysilane. The substrates can be of any suitable dry thickness including but not limited to at least 10 µm and up to and including 10 mm, depending upon the intended use of the resulting articles.

Particularly useful substrates are composed of poly(ethylene terephthalate) such as biaxially oriented poly(ethylene terephthalate) (PET) films that have broad uses in the electronics market. These PET films, ranging in dry thickness of at least 50 µm and up to and including 200 µm, can also comprise, on at least one side, a polymeric primer layer (also known as a subbing layer, adhesive layer, or binder layer) that can be added prior to or after film stretching. Such polymeric primer layers can comprise poly(acrylonitrile-co-vinylidene chloride-co-acrylic acid), poly(methyl acrylate-co-vinylidene chloride-co-itaconic acid), poly(glycidyl methacrylate-co-butyl acrylate), or various water-dispersible polyesters, water-dispersible polyurethanes, or water-dispersible polyacrylics, as well as sub-micrometer silica particles. The dry thickness of the primer layer can be at least 0.1 µm and up to and including 1 µm.

Thus, with the application of the described reactive composition to a suitable substrate, with or without appropriate drying, the present invention provides a precursor article comprising a substrate and having disposed thereon a polymeric layer comprising a reactive composition that comprises a reactive polymer that comprises (1) pendant groups that are capable of providing pendant sulfonic acid groups upon exposure of the reactive polymer to radiation having a $\lambda_{max}$ of at least 150 nm and up to and including 450 nm, and (2) pendant groups that are capable of reacting in the presence of the sulfonic acid groups to provide crosslinking in the reactive polymer.

Uses of Reactive Compositions

The reactive compositions described herein can be used to form surface patterns for various purposes as described above. The following discussion provides some details about representative electroless plating methods in which the reactive compositions can be used.

In these electroless plating methods, each aqueous-based "processing" solution, dispersion, or bath (for example, solutions containing electroless seed metal ions, reducing agent solutions, and solutions for electroless plating, as well as rinsing solutions) used at various points can be specifically designed with essential components as well as optional addenda that would be readily apparent to one skilled in the art. For example, one or more of those aqueous-based processing solutions can include such addenda as surfactants, anti-coagulants, anti-corrosion agents, anti-foamants, buffers, pH modifiers, biocides, fungicides, and preservatives. The aqueous-based reducing solutions can also include suitable antioxidants.

The method of this invention for forming a pattern in a polymeric layer, comprises:

providing a polymeric layer (as in forming the described precursor article), the polymeric layer comprising the reactive composition described above, comprising a reactive polymer as described above. This polymeric layer can be formed on a suitable substrate, if desired, as described above by suitable application of the reactive composition, after which the reactive composition is typically dried before the resulting article is used in the method of this invention.

This polymeric layer in the precursor article, usually in dry form, can be then patternwise exposed to radiation having a $\lambda_{max}$ of at least 150 nm and up to and including 450 nm or to radiation having a $\lambda_{max}$ of at least 150 nm and up to and including 330 nm, to provide a polymeric layer comprising non-exposed regions and exposed regions comprising a polymer comprising pendant sulfonic acid groups. This exposure can be provided with any suitable exposing source or device that provides the desired radiation including but not limited to, various arc lamps and LED sources. The particular exposing source can be chosen depending upon the absorption characteristics of the reactive composition used. The exposing radiation can be projected through lenses or a lens or mask element that can be in physical contact or in proximity with the outer surface of the polymeric layer. Exposure time can range from a fraction (0.1) of a second and up to and including 10 minutes depending upon the intensity of the radiation source and the reactive composition. Suitable masks can be obtained by known methods including but not limited to photolithographic methods, flexographic methods, or vacuum deposition of a chrome mask onto a suitable substrate such as quartz or high quality optical glass followed by photolithographic patterning.

At any time after the patternwise exposing and optional heating procedures, the reactive composition remaining in the non-exposed regions of the polymeric layer can be removed using an organic solvent in which the polymeric layer comprising the reactive composition is soluble or dispersible. In such procedures at least 50 weight % and typically at least 80 weight % or even at least 90 weight % of the reactive composition is removed in the non-exposed regions of the polymeric layer, based on the total amount of reactive composition originally present in the polymeric layer in the non-exposed regions. Upon this removal of reactive composition from the non-exposed regions of the polymeric layer, the various articles described herein will contain de-blocked and crosslinked polymer in the exposed regions of the polymeric layer, along with reducing agent molecules, electroless seed metal ions, electroless seed metal nuclei, or electroless plated metal, depending upon the stage at which the non-exposed reactive composition has been removed.

The removal procedure can be carried out in any suitable manner, including immersion of the intermediate article into a suitable organic solvent or mixture of organic solvents or by spraying the organic solvent or mixture of organic solvents onto the intermediate article surface. Contact with the organic solvent (or mixture thereof) can be carried out for a suitable time and temperature so that reactive composition is desirably removed in the non-exposed regions but little removal (less than 10 weight % of the total material) occurs in the exposed regions containing the de-blocked and crosslinked polymer. For example, the contact time can be at least 10 seconds and up to and including 10 minutes, and the contact temperature can be at room temperature (about 20° C.) and up to and including 50° C.

Organic solvents that can used for this purpose include but are not limited to ketones, such as 2-butanone, cyclopentanone and cyclohexanone, substituted benzenes such as chlorobenzene and anisole, ethyl lactate, propylene glycol methyl ether acetate, or γ-butyrolactone. Various mixtures of these organic solvents can be used if desired especially to dilute more toxic organic solvents with less toxic organic solvents such as blends of cyclopentanone with any of ethyl lactate, propylene glycol methyl ether acetate, or γ-butyrolactone.

In many embodiments, removing the reactive composition in the non-exposed regions of the polymeric layer is carried out immediately after the patternwise exposure and any optional heating procedure.

At this point, an intermediate article has been created in which the exposed regions of the polymeric layer on the substrate comprise de-blocked and crosslinked polymer that is derived from a reactive polymer in a reactive composition as described above, and the non-exposed regions of the polymeric layer comprise little or no reactive composition.

Once patternwise exposure has been carried out, the exposed regions of the polymeric layer are contacted with electroless seed metal ions to form a pattern of coordinated electroless seed metal ions in the exposed regions of the polymeric layer containing the de-blocked and crosslinked polymer. These electroless seed metal ions form catalytic sites for electroless metal plating (deposition of metal). There are various ways that this contacting can be carried out. Typically, the entire precursor article is immersed within a dilute aqueous-based solution, bath, or dispersion of the electroless seed metal ions for a sufficient time to coordinate the optimum number of electroless seed metal ions within the pendant sulfonic acid groups in the exposed regions of the polymeric layer. For example, this contact with the electroless seed metal ions can be carried out for at least 1 second and up to and including 30 minutes, at room temperature (about 20° C.) or at a higher temperature of up to and including 95° C. The time and temperature for this contact can be optimized for a given polymeric layer and electroless seed metal ions that are to be used.

Representative electroless seed metal ions that can be used in these procedures are selected from the group consisting of silver ions, platinum ions, palladium ions, gold ions, tin ions, rhodium ions, iridium ions, nickel ions, and copper ions. Most noble metal ions can serve as electroless seed metal ions in the present invention. These electroless seed metal ions can be provided in the form of a suitable metal salt or metal-ligand complex (that can have an overall positive, negative, or neutral charge). Useful materials of this type include but not limited to, metal salts and metal-ligand complexes of nitrates, halides, acetates, cyanides, amines, nitriles, thiocyanates, and sulfates. Thus, the electroless seed metal ions can be provided from simple salts or in the form of metal-ligand complexes. The amount of metal salts or metal-ligand complexes present in the aqueous-based solution would be readily apparent to one skilled in the art and can optimized for a particular reactive composition and exposure procedure. For example, the metal salts or metal-ligand complexes can be present in the aqueous-based solution in an amount sufficient to provide at least 0.00001 molar and up to and including 2 molar of the desired electroless metal ions. In one embodiment, a 0.4 molar silver nitrate solution can be used at room temperature to provide electroless seed silver ions.

The contact with the electroless seed metal ions produces an intermediate article comprising a substrate and having disposed thereon a polymeric layer comprising exposed regions and non-exposed regions, the exposed regions comprising a pattern of electroless seed metal ions within the de-blocked and crosslinked polymer resulting from the irradiation of a reactive polymer in a reactive composition as described above, and the non-exposed regions comprising the reactive composition described herein comprising a reactive polymer as described above.

After the requisite time to react the electroless seed metal ions within with the de-blocked and crosslinked polymer in the exposed regions, the polymeric layer can be rinsed with distilled or deionized water or another aqueous-based solution for a suitable time and at a suitable temperature, for example usually room temperature or slightly higher.

Optionally at this point, the polymeric layer can be removed from the non-exposed regions as described above, leaving the pattern of electroless seed metal ions in the exposed regions of the polymeric layer.

If this procedure is carried out, an intermediate article is created that comprises a substrate and having disposed thereon exposed regions of a de-blocked and crosslinked polymer derived from a reactive polymer in a reactive composition as described above, and non-exposed regions of the polymeric layer comprising little or no reactive composition, wherein the exposed regions further comprise a pattern of electroless seed metal ions coordinated within the de-blocked and crosslinked polymer.

The electroless seed metal ions in the exposed regions of the polymeric layer are then contacted with a non-reducing reagent that reacts with the electroless seed metal ions to form an electroless seed metal compound (containing the non-reducing reagent) deposited within the exposed regions of the polymeric layer containing the de-blocked and crosslinked polymer derived from the reactive polymer in a reactive composition as described above.

Useful non-reducing reagents include any compound that will covalently, ionically, or otherwise bond to or react with the electroless seed metal ions to form the electroless seed metal compound. Useful non-reducing reagents include those that provide electroless seed metal compounds having a $pK_{sp}$ value of less than 40, for example greater than 4 and less than 40. For example, such useful non-reducing reagent include but are not limited to alkali metal and ammonium hydroxides, thiosulfates, thiocyanates, sulfites, carboxylates, small organic acids, and combinations thereof. Halides are also useful non-reducing reagents for purposes of this invention. Alkali metal hydroxides are particularly useful including mixtures thereof.

This contacting procedure can be carried out in various ways including immersing the intermediate article in an aqueous-based non-reducing solution comprising one or more non-reducing reagents at a concentration of at least 1 weight % based on total aqueous-based non-reducing solution weight. Alternatively, an aqueous-based non-reducing solution can be sprayed or coated onto the polymeric layer in the intermediate article. The time and temperature for this contacting would be readily apparent to one skilled in the art in order to best achieve the desired bonding. For example, the contacting can be carried out at room temperature (about 20°

C.) and up to and including 95° C. and the time can be for at least 1 second and up to and including 30 minutes.

After this contact with the non-reducing reagent, the polymeric layer, especially the exposed regions, can be again washed using distilled water or deionized water or another aqueous-based solution under suitable conditions of time and temperature.

At this stage, another intermediate article has been created, which intermediate article comprises a substrate and having disposed thereon a polymeric layer comprising exposed regions and non-exposed regions, the exposed regions comprising a pattern of an electroless seed metal compound (comprising a non-reducing reagent as described above) in a de-blocked and crosslinked polymer derived from a reactive polymer in a reactive composition as described herein, and the non-exposed regions comprising a reactive composition described herein comprising a reactive polymer as described above.

Optionally at this point, the polymeric layer can be removed from the non-exposed regions as described above, leaving the pattern of electroless seed metal compound in the exposed regions of the polymeric layer.

If this procedure is carried out, an intermediate article is created that comprises a substrate and having disposed thereon exposed regions of a de-blocked and crosslinked polymer derived from a reactive polymer in a reactive composition described herein, and non-exposed regions of the polymeric layer comprising little or no reactive composition, wherein the exposed regions further comprise a pattern of electroless seed metal compound (comprising the non-reducing compound as described above).

This treated article can be immediately immersed in an aqueous-based electroless metal plating bath or solution, or the treated article can be stored with just the catalytic pattern comprising corresponding electroless seed metal for use at a later time.

The article can be contacted with an electroless plating metal that is the same as or different from the corresponding electroless seed metal. In most embodiments, the electroless plating metal is a metal different from the metal within the electroless seed metal compound.

Any metal that will likely electrolessly "plate" on the corresponding electroless seed metal compound can be used at this point, but in most embodiments, the electroless plating metal can be for example copper(II), silver(I), gold(IV), palladium(II), platinum(II), nickel(II), chromium(II), and combinations thereof. Copper(II), silver(I), and nickel(II) are particularly useful electroless plating metals.

The one or more electroless plating metals can be present in an aqueous-based electroless plating bath or solution in an amount of at least 0.01 weight % and up to and including 20 weight % based on total solution weight.

Electroless plating can be carried out using known temperature and time conditions, as such conditions are well known in various textbooks and scientific literature. It is also known to include various additives such as metal complexing agents or stabilizing agents in the aqueous-based electroless plating solutions. Variations in time and temperature can be used to change the metal electroless plating thickness or the metal electroless plating deposition rate.

A useful aqueous-based electroless plating solution or bath is an electroless copper(II) plating bath that contains formaldehyde as a reducing agent. Ethylenediaminetetraacetic acid (EDTA) or salts thereof can be present as a copper complexing agent. For example, copper electroless plating can be carried out at room temperature for several seconds and up to several hours depending upon the desired deposition rate and plating metal thickness.

Other useful aqueous-based electroless plating solutions or baths comprise silver(I) with EDTA and sodium tartrate, silver(I) with ammonia and glucose, copper(II) with EDTA and dimethylamineborane, copper(II) with citrate and hypophosphite, nickel(II) with lactic acid, acetic acid, and a hypophosphite, and other industry standard aqueous-based electroless baths or solutions such as those described by Mallory et al. in *Electroless Plating: Fundamentals and Applications* 1990.

After the electroless plating procedure, the product article is removed from the aqueous-based electroless plating bath or solution and can again be washed using distilled water or deionized water or another aqueous-based solution to remove any residual electroless plating chemistry. At this point, the polymeric layer and electrolessly plated metal are generally stable and can be used for their intended purpose.

Thus, this method provides a product article comprising a substrate and having disposed thereon a polymeric layer comprising exposed regions and non-exposed regions, the exposed regions comprising a pattern of an electroless seed metal compound (comprising a non-reducing agent as described above) which has been electrolessly plated with the same or different metal that is part of the electroless seed metal compound, the exposed regions containing a de-blocked and crosslinked polymer derived from a reactive polymer in a reactive composition described herein, and the non-exposed regions comprising a reactive composition as described herein comprising a reactive polymer as described above.

Optionally at this point, the reactive composition can be removed from the non-exposed regions of the polymeric layer after electrolessly plating the corresponding electroless seed metal nuclei so that the resulting product article comprises a pattern of an electroless seed metal compound (comprising a non-reducing reagent as described above) that has been electrolessly plated with the same or different metal that is part of the electroless seed metal compound, but the product article comprises little or no reactive composition in the non-exposed regions of the polymeric layer.

To change the surface of the electroless plated metal for visual or durability reasons, it is possible that a variety of post-treatments can be employed including surface plating of still another (third) metal such as nickel or silver on the "second" electrolessly plated metal (this procedure is sometimes known as "capping"), or the creation of a metal oxide, metal sulfide, or a metal selenide layer that is adequate to change the surface color and scattering properties without reducing the conductivity of the electrolessly plated (second) metal. Depending upon the metals used in the various capping procedures of the method, is may be desirable to treat the electrolessly plated metal with a seed metal catalyst in an aqueous-based seed metal catalyst solution to facilitate deposition of additional metals.

As one skilled in the art should appreciate, the individual treatments or steps described above for this method can be carried out two or more times before proceeding to the next procedure or step. For example, the treatment with the aqueous-based solution containing electroless seed metal ions can be carried out two or more times in sequence, for example, with a rinsing step between sequential treatments. The electroless seed metal ions can be the same or different for the sequential treatments, the treatment conditions or compositions can be the same or different.

In addition, multiple treatments with an aqueous-based non-reducing solution or aqueous-based seed metal catalyst solution can be carried out in sequence, using the same or different non-reducing conditions and compositions. Sequential washing or rinsing steps can also be carried out where appropriate.

Further, the electroless plating procedures can be carried out multiple times, in sequence, using the same or different electroless plating metal and the same or different electroless plating conditions and times.

It is also possible to use this product article comprising the noted pattern of an electrolessly plated metal to incorporate a second or more patterns in the non-exposed regions. This can be accomplished by subjecting this product article to the same sequence of procedures or steps using the same or different reagents and aqueous-based solutions to provide at least a second pattern in what would be considered second exposed regions since the electrolessly plated metal would be in the what is considered the first exposed regions. The second exposed regions can comprise all of the original non-exposed regions, or they can comprise only some of the non-exposed regions.

For example, to create a second pattern in the product article having the electrolessly plated metal, the product article can be treated or processed as follows, using conditions and aqueous-based solutions similar to or the same as those described above:

a) patternwise exposing the previously non-exposed regions to form second exposed regions in the polymeric layer, b) optionally heating the polymeric layer, c) contacting at least the exposed regions with an aqueous-based solution containing electroless seed metal ions, and optionally rinsing, d) contacting the second exposed regions with an aqueous-based non-reducing solution, and optionally rinsing, and e) electrolessly plating the same or different metal in the exposed regions.

The present invention provides at least the following embodiments and combinations thereof, but other combinations of features are considered to be within the present invention as a skilled artisan would appreciate from the teaching of this disclosure:

1. A method for forming a pattern in a polymeric layer, the method comprising:

providing a polymeric layer comprising a reactive composition that comprises a reactive polymer that comprises (1) pendant groups that are capable of providing pendant sulfonic acid groups upon exposure of the reactive polymer to radiation having a $\lambda_{max}$ of at least 150 nm and up to and including 450 nm, and (2) pendant groups that are capable of reacting in the presence of the sulfonic acid groups to provide crosslinking in the reactive polymer, patternwise exposing the polymeric layer to radiation having a $\lambda_{max}$ of at least 150 nm and up to and including 450 nm, to provide a polymeric layer comprising non-exposed regions and exposed regions comprising a polymer comprising pendant sulfonic acid groups, contacting the exposed regions of the polymeric layer with electroless seed metal ions to form a pattern of electroless seed metal ions in the exposed regions of the polymeric layer, optionally contacting the pattern of electroless seed metal ions in the exposed regions of the polymeric layer with a non-reducing reagent that reacts with the electroless seed metal ions to form an electroless seed metal compound that has a $pK_{sp}$ of less than 40, and electrolessly plating the bound metal electroless seed metal compound in the exposed regions of the polymeric layer with a metal that is the same as or different from the metal that is within the bound electroless seed metal compound.

2. The method of embodiment 1, comprising contacting the exposed regions of the polymeric layer with electroless seed metal ions selected from the group consisting of silver ions, platinum ions, palladium ions, gold ions, tin ions, rhodium ions, iridium ions, nickel ions, and copper ions.

3. The method of embodiment 1 or 2, wherein the electroless seed metal ions are provided as a metal salt or metal-ligand complex.

4. The method of any of embodiments 1 to 3, comprising electrolessly plating with a metal that is selected from the group consisting of copper(II), silver(I), gold(IV), palladium (II), platinum(II), nickel(II), chromium(II), and combinations thereof.

5. The method of any of embodiments 1 to 4, comprising providing the polymeric layer on a substrate.

6. The method of any of embodiments 1 to 5, comprising patternwise exposing the polymeric layer to radiation having a $\lambda_{max}$ of at least 150 nm and up to and including 330 nm.

7. The method of any of embodiments 1 to 6, wherein the electroless seed metal compound has a $pK_{sp}$ of least 4 and less than 40.

8. The method of any of embodiments 1 to 7, comprising contacting the pattern of electroless seed metal ions in the exposed regions with the non-reducing agent that is a hydroxide, thiosulfate, carboxylate, or a combination thereof.

9. An intermediate article comprising a substrate and having disposed thereon a polymeric layer comprising exposed regions and non-exposed regions, the exposed regions comprising an electroless seed metal compound comprising a non-reducing reagent in a de-blocked and crosslinked polymer derived from a reactive polymer that comprises (1) pendant groups that are capable of providing pendant sulfonic acid groups upon exposure of the reactive polymer to radiation having a $\lambda_{max}$ of at least 150 nm and up to and including 450 nm, and (2) pendant groups that are capable of reacting in the presence of the sulfonic acid groups to provide crosslinking in the reactive polymer, the electroless seed metal compound having a $pK_{sp}$ of less than 40, and the non-exposed regions comprising a reactive composition that comprises the reactive polymer that comprises (I) pendant groups that are capable of providing pendant sulfonic acid groups upon exposure of the reactive polymer to radiation having a $\lambda_{max}$ of at least 150 nm and up to and including 450 nm, and (2) pendant groups that are capable of reacting in the presence of the sulfonic acid groups to provide crosslinking in the reactive polymer.

10. Any of embodiments 1 to 9, wherein the reactive polymer comprises a backbone and at least -A- and -B- recurring units, arranged randomly along the backbone, wherein:

the -A- recurring units comprise pendant aromatic sulfonic acid oxime ester groups, which recurring units are capable of providing pendant aromatic sulfonic acid groups upon irradiation with radiation having a $\lambda_{max}$ of at least 150 nm and up to and including 450 nm, the -A- recurring units being present in the reactive polymer in an amount of at least 25 mol % and up to and including 98 mol % based on total reactive polymer recurring units, and the -B- recurring units comprise pendant groups that can provide crosslinking upon generation of the pendant aromatic sulfonic acid groups in the -A- recurring units, the -B- recurring units being present in an amount of at least 2 mol % and up to and including 75 mol % based on total reactive polymer recurring units.

11. Embodiment 10, wherein the -A- recurring units are present in the reactive polymer in an amount of at least 40 mol % and up to and including 95 mol % based on total reactive polymer recurring units, and the -B- recurring units are present in the reactive polymer in an amount of at least 5 mol % and up to and including 60 mol % based on total reactive polymer recurring units.

12. Embodiment 10 or 11, wherein the -A- recurring units are present in the reactive polymer in an amount of at least 60 mol % and up to and including 95 mol % based on total reactive polymer recurring units, and the -B-recurring units are present in the reactive polymer in an amount of at least 5 mol % and up to and including 40 mol % based on total reactive polymer recurring units.

13. Any of embodiments 10 to 12, wherein the -B- recurring units comprise pendant crosslinking epoxy groups.

14. Any of embodiments 10 to 13, wherein the reactive polymer further comprises one or more additional recurring units that are different from all -A- and -B- recurring units.

15. Embodiment 14, wherein the reactive polymer further comprises one or more additional recurring units that are derived from one or more ethylenically unsaturated polymerizable monomers selected from the group consisting of alkyl acrylates, alkyl methacrylates, (meth)acrylamides, vinyl esters, (meth)acrylonitrile, maleic anhydrides, maleic imides, and styrene and styrene derivatives.

16. Embodiment 14 or 15, wherein the one or more additional recurring units are present in an amount of at least 1 mol % and up to and including 25 mol % based on the total reactive polymer recurring units.

17. Any of embodiments 1 to 16, wherein the reactive polymer comprises at least 50 weight % and up to and including 100 weight % of the total dry weight of the polymeric layer.

The following Examples are provided to illustrate the practice of this invention and are not meant to be limiting in any manner.

The "TOSS" monomer was prepared using the following synthetic preparation:

I-1 Invention Reactive Polymer and C-1 Comparative polymer were prepared using the following general synthetic scheme showing a copolymer 4 derived from the TOSS monomer and glycidyl methacrylate (Gm) which general synthetic reaction scheme is not to be considered limiting for the present invention. The reactants 1 and 2 and TOSS monomer 3 were prepared as described below.

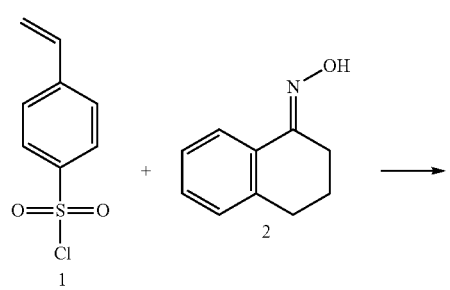

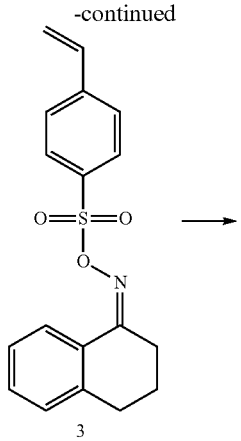

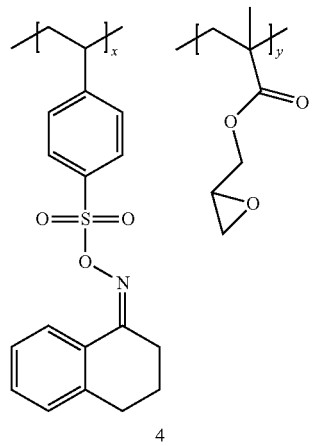

p-Styrenesulfonyl chloride 1 was prepared from sodium p-styrenesulfonate and thionyl chloride according to the method reported by Kamogawa et al. [*Bull. Chem. Soc. Jpn.,* 56, 762-765 (1983)].

α-Tetralone oxime 2 was prepared from α-tetralone according to the method reported by Zhao et al. [*Organic Lett.,* 10, 505-507 (2008)] with the following modifications:

A single neck 1 liter round bottom flask with magnetic stirring was charged with α-tetralone oxime (33.00 g, 0.226 mol), hydroxylamine hydrochloride (24.0 g, 0.345 mol), sodium acetate (31.67 g, 0.386 mol), 200 ml of water, and 200 ml of methanol and heated under nitrogen at reflux temperature for 4 hours. The mixture was allowed to cool and then placed in a freezer overnight to crystallize the reaction product. The resulting white crystals were collected, rinsed with methanol, and dried to yield 28.54 g (78%) of the desired oxime 2.

1,2,3,4-Tetrahydro-1,-naphthylideneamino p-styrenesulfonate 3 was prepared according to the method reported by M. Shirai et al. [*Macromolecules,* 25, 195-200 (1992)] with the following modifications (the prepared reaction solution and resulting TOSS monomer 3 were protected from room light as much as possible during the reaction and workup):

A single neck 250 ml amber round bottom flask with magnetic stirring was charged with α-tetralone oxime (7.95 g, 0.049 mol), pyridine (15.0 g, 0.380 mol) and cooled in an ice bath to 0° C. p-Styrenesulfonyl chloride (10.0 g, 0.049 mol) was added dropwise while keeping the reaction solution temperature below 5° C. The reaction solution was allowed to warm to room temperature and the reaction was monitored by thin layer chromatography (TLC, silica gel with 100% methylene chloride eluting solvent). When the desired reaction was complete (about 4 hours), methylene chloride (100 ml) and a 10% hydrochloric acid solution (100 ml) were added and the desired product was extracted twice using 100 ml of methylene chloride. The extracts were combined and washed with water (twice with 100 ml), dried over magnesium sulfate, and evaporated to dryness. The residue was purified by TLC (silica gel with 100% methylene chloride eluting solvent) to yield 11.66 g (72%) of a white solid TOSS monomer 3. Due to the instability of the TOSS monomer as a solid, it was stored as a solution in tetrahydrofuran (THF, 25% solids) in the refrigerator for up to 3 days before it was used to prepare reactive polymers as described below.

The "FLOSS" monomer having the following recurring unit structure was prepared similarly to the TOSS monomer using the synthesis described by Shirai et al. Reactive & Functional Polymers, 37 (1998), pp. 147-154:

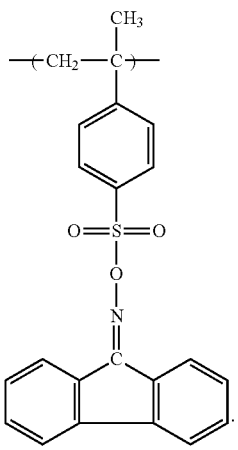

Preparation of I-1 Inventive Reactive Polymer:

During preparation and use, all of the reactive polymers were protected from room light as much as possible. For I-1 inventive reactive polymer, having a composition of 80:20 nominal mol ratio of TOSS monomer ("-A-" recurring units) 3 1,2,3,4-tetrahydro-1,-naphthylideneamino p-styrene-sulfonate (3.00 g, 0.0092 mol) and glycidyl methacrylate (Gm, 0.33 g, 0.0023 mol), the two ethylenically unsaturated polymerizable monomers were dissolved in THF (10.0 g, 15% solids) in a 100 ml amber round bottom and purged with nitrogen for about 30 minutes. A polymerization initiator, 2,2'-azobisisobutyronitrile, was added (0.06 g, 0.0003 mol, 3 mol % of combined monomers) and the flask was sealed with a secured septum and set in a preheated oil bath at 65° C. for 10 hours (polymerizations were run between 5 and 10 hours with 8 hours being the optimum time). The reaction solution was cooled and precipitated into ethyl acetate (300 ml) and the resulting solid reactive polymer was collected by filtration and dried. The solid reactive polymer was re-dissolved in THF at 25% solids and precipitated into methanol (300 ml). The solid reactive polymer was collected by filtration and dried to yield 2.46 g (74%) that were dissolved in THF at 15% solids and 1,2,2,6,6-pentamethylpiperidine (12.3 µl, 1 mol % based on the -A- recurring units in the reactive polymer) was added to provide storage stability. The resulting solution was stored in the refrigerator for up to 4 months before use. The resulting I-1 inventive reactive polymer was characterized as follows to determine that the desired reactive polymer was obtained.

Characterization Data by NMR:

Approximately 150 mg of the I-1 inventive reactive polymer was dissolved in 3 ml of $CD_2Cl_2$. TMS was added as a chemical shift reference and $Cr(acac)_3$ was added as a relaxation agent. A $^{13}C$ NMR spectrum was obtained at 125 MHz under quantitative conditions. The actual mol % of each type of recurring unit in the reactive polymer was determined from integral averages from several resonances of each recurring unit.

Characterization Data by SEC:

The sample of I-1 inventive reactive polymer was examined using size-exclusion chromatography (SEC) at 35.0° C. in N,N-dimethylformamide (DMF) containing 0.01 molar lithium nitrate. The column set consisted of three 8 mm×300 mm GRAM Linear M columns from Polymer Standards Services, calibrated with narrow-molecular-weight distribution poly(methyl methacrylate) (PMMA) standards. This system has multiple detectors that measure differential refractive index, UV-Visible absorption, and viscosity of the eluent. The results were plotted as the normalized differential logarithmic molecular weight distribution where the ordinate "$W_n$ (log M)" is the weight fraction of polymer per log M increment. The number-average ($M_n$), weight-average ($M_w$), z-average ($M_z$) molecular weights and intrinsic viscosity in units of dl/g in DMF at 35.0° C. (if applicable) are determined. The long-term 3σ coefficient of variation for $M_w$ of a broad PMMA standard was ±5%. Only $M_w$ values are shown below in TABLE I.

I-2 through I-11 invention reactive polymers and C-1 through C-5 comparative polymers (outside the invention) were prepared in the same manner with varying nominal molar ratios of the ethylenically unsaturated polymerizable monomers as shown below in TABLE I. These polymers were also characterized for actual recurring unit mol % and molecular weight in the same manner. The -C- Monomer and -C- Recurring Units refer to specific additional ethylenically unsaturated polymerizable monomer used to prepare inventive reactive polymers and comparative polymers as identified in TABLE 1. The TOSS and FLOSS recurring units are representative examples of the -A- recurring units and Gm is a representative example of the -B- recurring units in the definition of the inventive reactive polymers.

TABLE I

| Polymer | TOSS Monomer (nominal mol %) | TOSS Recurring Unit (actual mol %)[a] | Gm Monomer (nominal mol %) | Gm Recurring Unit[b] (actual mol %)[a] | -C- Monomer (nominal mol %) | -C- Recurring Unit (actual mol %)[a] | Polymer $M_w$ |
|---|---|---|---|---|---|---|---|
| I-1 | 80 | 86 | 20 | 14 | 0 | 0 | 39,900 |
| I-2 | 60 | 69 | 40 | 31 | 0 | 0 | 47,300 |
| I-3 | 80 | 85 | 20 | 15 | 0 | 0 | 96,300 |
| C-1 | 100 | 100 | 0 | 0 | 0 | 0 | 108,000 |
| I-4 | 80 | 84 | 20 | 16 | 0 | 0 | 126,000 |
| I-5 | 80 | 83 | 20 | 17 | 0 | 0 | 82,900 |

TABLE I-continued

| Polymer | TOSS Monomer (nominal mol %) | TOSS Recurring Unit (actual mol %)[a] | Gm Monomer (nominal mol %) | Gm Recurring Unit[b] (actual mol %)[a] | -C- Monomer (nominal mol %) | -C- Recurring Unit (actual mol %)[a] | Polymer $M_w$ |
|---|---|---|---|---|---|---|---|
| C-2 | 20 | 24 | 80 | 76 | 0 | 0 | 45,600 |
| I-6 | 50 | 55 | 50 | 45 | 0 | 0 | 49,700 |
| I-7 | 80 | 87 | 10 | 9.4 | 10 | n-butyl acrylate 3.5 | 292,000 |
| I-8 | 80 | 83 | 10 | 7.7 | 10 | n-butyl methacrylate 8.8 | 277,000 |
| C-3 | 80 | 89 | 0 | 0 | 20 | 2-phenoxyethyl acrylate 11 | 64,700 |
| C-4 | 80 | 90.8 | 0 | 0 | 20 | n-butyl acrylate 9.2 | 73,400 |
| I-9 | 80 | 85 | 10 | 11 | 10 | n-butyl acrylate 3.8 | 223,000 |
| I-10 | 70 | 77 | 20 | 19 | 10 | n-butyl acrylate 4 | 109,000 |
| I-11 | 70 | 79 | 20 | 16 | 10 | 2-phenoxyethyl acrylate 4.5 | 101,000 |

[a] mol % determined by NMR
[b] Derived from glycidyl methacrylate

Additional polymers were prepared similarly to the polymers described above and TABLE II provides a summary of the additional polymers and the nominal mol % of the recurring units derived from the noted ethylenically unsaturated polymerizable monomers. Polymers A, C, D, E, F, I, and K are inventive reactive polymers useful in the present invention and Polymers B, G, H, and J are comparative polymers outside of the present invention.

TABLE II

| Polymer | TOSS Monomer | Glycidyl methacrylate | n-Butyl acrylate | 2-Phenoxyethyl acrylate | FLOSS Monomer |
|---|---|---|---|---|---|
| A | 80 | 20 | 0 | 0 | 0 |
| B | 100 | 0 | 0 | 0 | 0 |
| C | 60 | 40 | 0 | 0 | 0 |
| D | 90 | 10 | 0 | 0 | 0 |
| E | 80 | 10 | 10 | 0 | 0 |
| F | 70 | 20 | 10 | 0 | 0 |
| G | 80 | 0 | 20 | 0 | 0 |
| H | 80 | 0 | 0 | 20 | 0 |
| I | 0 | 20 | 0 | 0 | 80 |
| J | 20 | 80 | 0 | 0 | 0 |
| K | 50 | 50 | 0 | 0 | 0 |

Preparation of the Electroless Copper Plating Bath C1:

The following components were dissolved in a glass container that was cleaned with concentrated nitric acid followed by a thorough rinse with distilled water to eliminate any trace of metal on the glass: 1.8 g of copper(II) sulfate pentahydrate, 6.25 g of tetrasodium EDTA (ethylenediaminetetraacetic acid, tetrahydrate), 0.005 g of potassium ferrocyanide trihydrate, 2.25 g of 37 weight % formaldehyde solution, 80 g of distilled water, and about 2 to 3 g of a 45 weight % sodium hydroxide solution to adjust the pH to 12.8.

Preparation of Precursor Articles and Patternwise Exposure:

Reactive composition formulations were prepared using the dry isolated powder of Inventive reactive polymers and Comparative polymers by dissolving each of them in an organic solvent to yield a concentration of 15% solids. An amount (0.15% solids) of 1,2,2,6,6-pentamethyl piperidine was added to each solution to act as a storage stabilizer. A polymeric layer of each reactive formulation was prepared by either extrusion coating or spin coating each formulation at 1200 RPM onto a poly(ethylene terephthalate) film (PET) having thereon a crosslinked adhesion layer comprising a copolymer derived from n-butyl acrylate and glycidyl methacrylate to form precursor articles.

Each precursor article having the polymeric layer was patternwise exposed to broadband ultraviolet light through a chrome-on-quartz contact mask. Each patternwise exposed precursor article was then immersed in a series of processing baths as described below in the following Examples.

Inventive Example 1

Polymer A was dissolved in dichloromethane solvent to 15% solids as described above and 3.3 g of this Polymer A solution was added to 1.7 g of cyclopentanone. The resulting reactive composition was spin coated onto a PET substrate to form a precursor article. After being dried, the resulting polymeric layer was exposed through a mask to an Oriel high intensity UV lamp for 600 seconds. The exposed polymeric layer was then immersed in a 0.4 molar silver nitrate bath for 3 minutes, rinsed in distilled water for 2 minutes, immersed in a 0.01 molar potassium hydroxide bath for 5 minutes, rinsed in distilled water for 2 minutes, and then dried with compressed nitrogen. The intermediate polymeric layer was immersed in electroless copper bath C1 for 3 minutes at 20° C., washed in distilled water for 4 minutes, and then dried with compressed nitrogen. The resulting copper pattern exhibited high conductivity in both large exposed regions and fine line exposed regions that were 5 to 6 μm in width in the resulting product article. The non-exposed regions were clear and did not contain conductive copper. The results are summarized below in TABLE III.

Comparative Example 1

Polymer B was dissolved in tetrahydrofuran solvent to 15% solids as described above and 3.3 g of this Polymer B solution was added to 1.7 g of tetrahydrofuran. The resulting reactive composition was spin coated onto a PET substrate to form a precursor article. After being dried, the resulting polymeric layer was exposed through a mask to an Oriel high intensity UV lamp for 600 seconds. The exposed polymeric layer was then immersed in a 0.4 molar silver nitrate bath for 3 minutes, rinsed in distilled water for 2 minutes, immersed in a 0.01 molar potassium hydroxide bath for 5 minutes, rinsed in distilled water for 2 minutes, and then dried with compressed nitrogen. The film was immersed in electroless copper bath C1 for 3 minutes at 20° C., washed in distilled water for 4 minutes, and then dried with compressed nitrogen. The resulting copper pattern exhibited no conductivity in any exposed regions as virtually all polymer layer in the exposed had washed off in the resulting product article. The results are summarized below in TABLE III.

Comparative Example 2

Polymer J was dissolved in dichloromethane solvent to 15% solids as described above and 3.3 g of this Polymer J solution was added to 1.7 g of cyclopentanone. The resulting reactive composition was spin coated onto a PET substrate to form a precursor article. After being dried, the resulting polymeric layer was exposed through a mask to an Oriel high intensity UV lamp for 600 seconds. The exposed polymeric layer was then immersed in a 0.4 molar silver nitrate bath for 3 minutes, rinsed in distilled water for 2 minutes, immersed in a 0.01 molar potassium hydroxide bath for 5 minutes, rinsed in distilled water for 2 minutes, and then dried with compressed nitrogen. The intermediate polymeric layer was immersed in electroless copper bath C1 for 3 minutes at 20° C., washed in distilled water for 4 minutes, and then dried with compressed nitrogen. The electrolessly plated polymeric layer exhibited a yellow to neutral grey color in the exposed regions, but all such regions were nonconductive in the resulting product article. The results are summarized below in TABLE III.

Inventive Example 2

Polymer K was dissolved in dichloromethane solvent to 15% solids as described above and 3.3 g of this Polymer K solution was added to 1.7 g of cyclopentanone. The resulting reactive composition was spin coated onto a PET substrate to form a precursor article. After being dried, the resulting polymeric layer was exposed through a mask to an Oriel high intensity UV lamp for 600 seconds. The exposed polymeric layer was then immersed in a 0.4 molar silver nitrate bath for 3 minutes, rinsed in distilled water for 2 minutes, immersed in a 0.01 molar potassium hydroxide bath for 5 minutes, rinsed in distilled water for 2 minutes, and then dried with compressed nitrogen. The intermediate polymeric layer was immersed in electroless copper bath C1 for 3 minutes at 20° C., washed in distilled water for 4 minutes, and then dried with compressed nitrogen. The resulting copper pattern exhibited high conductivity in both large exposed regions and fine line exposed regions that were 5 to 6 µm in width in the resulting product article. The non-exposed regions were clear and did not contain conductive copper. The results are summarized below in TABLE III.

TABLE III

| Example | Polymer | Large Exposed Regions | Fine Exposed Regions | Non-exposed Regions |
| --- | --- | --- | --- | --- |
| Invention 1 | A | Conductive | Conductive | Non-conductive |
| Comparison 1 | B | Washed off | Washed off | Non-conductive |
| Comparison 2 | J | Non-conductive | Non-conductive | Non-conductive |
| Invention 2 | K | Conductive | Conductive | Non-conductive |

The results provided in TABLE III above show that the crosslinkable recurring units must be present in the reactive polymer to provide an acceptable working image that survives the various procedures in aqueous-based processing solutions. These results also show that the recurring units comprising ion exchange sulfuric acid groups should be present in the reactive polymer in an amount greater than 20% of the total recurring units to form a desired conductive image.

Comparison Example 3

Polymer A was dissolved in dichloromethane solvent to 15% solids as described above, and 3.3 g of this Polymer A solution was added to 1.7 g of cyclopentanone. The resulting reactive composition was spin coated onto a PET substrate to provide a precursor article. After being dried, the resulting precursor article was exposed through a mask to an Oriel high intensity UV lamp for 600 seconds. The exposed precursor article was then immersed in a 0.4 molar silver nitrate bath for 3 minutes, rinsed in distilled water for 2 minutes, immersed in a 0.5 weight % potassium sulfide bath for 5 minutes, rinsed in distilled water for 2 minutes, and then dried with compressed nitrogen. The optical density of this treated article was measured in a large exposed region of the polymeric layer. The intermediate article was then immersed in aqueous-based copper electroless plating bath C1 for 3 minutes at 20° C., washed in distilled water for 4 minutes, and then dried with compressed nitrogen. The optical density was re-measured in the same large exposed region. The resulting product article exhibited no conductivity in both large exposed regions and fine exposed lines that were 5 to 6 µm in width. The results are summarized below in TABLE IV. While Polymer A is an inventive reactive polymer, the product article provided in this Comparative Example 3 was not acceptable because the non-reducing reagent (potassium sulfide) provided an electroless seed metal compound having a $pK_{sp}$ greater than 40.

Comparison Example 4

Polymer B was dissolved in tetrahydrofuran solvent to 15% solids as described above and 3.3 g of this Polymer B solution was added to 1.7 g of tetrahydrofuran. The resulting reactive composition was spin coated onto a PET substrate to form a precursor article. After being dried, the resulting precursor article was exposed through a mask to an Oriel high intensity UV lamp for 600 seconds. The exposed precursor article was then immersed in a 0.4 molar silver nitrate bath for 3 minutes, rinsed in distilled water for 2 minutes, immersed in a 0.5 weight % potassium sulfide bath for 5 minutes, rinsed in distilled water for 2 minutes, and then dried with compressed nitrogen. The optical density was measured in a large exposed region of the polymeric layer of the treated article. The intermediate article was then immersed in the aqueous-based copper electroless bath C1 for 3 minutes at 20° C., washed in distilled water for 4 minutes, and then dried with compressed nitrogen. The optical density was re-measured in the same large exposed region. The resulting product article exhibited no conductivity in both large exposed regions areas and fine exposed lines that were 5 to 6 μmicrons in width. The results are summarized below in TABLE IV.

Comparison Example 5

Polymer J was dissolved in dichloromethane solvent to 15% solids as described above and 3.3 g of this Polymer J solution was added to 1.7 g of cyclopentanone. The resulting reactive composition was spin coated onto a PET substrate to form a precursor article. The resulting precursor article was exposed through a mask to an Oriel high intensity UV lamp for 600 seconds. The exposed precursor article was then immersed in a 0.4 molar silver nitrate bath for 3 minutes, rinsed in distilled water for 2 minutes, immersed in a 0.5 weight % potassium sulfide bath for 5 minutes, rinsed in distilled water for 2 minutes, and then dried with compressed nitrogen. The optical density was measured in a large exposed region of the polymeric layer of the treated article. The intermediate article was then immersed in the aqueous-based electroless copper bath C1 for 3 minutes at 20° C., washed in distilled water for 4 minutes, and then dried with compressed nitrogen. The optical density was re-measured in the same large exposed region. The resulting product article exhibited no conductivity in both the large exposed regions and fine exposed lines that were 5 to 6 μm in width in the resulting product article. The results are summarized below in TABLE IV.

Comparison Example 6

Polymer K was dissolved in dichloromethane solvent to 15% solids as described above and 3.3 g of this Polymer K solution was added to 1.7 g of cyclopentanone. The resulting reactive composition was spin coated onto a PET substrate to provide a precursor article. The resulting precursor article was exposed through a mask to an Oriel high intensity UV lamp for 600 seconds. The exposed precursor article was then immersed in a 0.4 molar silver nitrate bath for 3 minutes, rinsed in distilled water for 2 minutes, immersed in a 0.5 weight % potassium sulfide bath for 5 minutes, rinsed in distilled water for 2 minutes, and then dried with compressed nitrogen. The optical density was measured in a large exposed region of the polymeric layer of the treated article. The intermediate article was then immersed in the aqueous-based electroless copper bath C1 for 3 minutes at 20° C., washed in distilled water for 4 minutes, and then dried with compressed nitrogen. The optical density was re-measured in the same large exposed region. The resulting product article exhibited no conductivity in both large exposed regions and fine exposed lines that were 5 to 6 μm in width. The results are summarized below in TABLE IV. While Polymer A is an inventive reactive polymer, the product article provided in this Comparative Example 6 was not acceptable because the non-reducing reagent (potassium sulfide) provided an electroless seed metal compound having a $pK_{sp}$ greater than 40.

Invention Example 3

Polymer A was dissolved in dichloromethane solvent to 15% solids as described above and 3.3 g of this Polymer A solution was added to 1.7 g of cyclopentanone. The resulting reactive composition was spin coated onto a PET substrate to form a precursor article. The resulting precursor article was exposed through a mask to an Oriel high intensity UV lamp for 600 seconds. The exposed precursor article was then immersed in a 0.4 molar silver nitrate bath for 3 minutes, rinsed in distilled water for 2 minutes, immersed in a 1.0 weight % sodium oxalate bath for 5 minutes, rinsed in distilled water for 2 minutes, and then dried with compressed nitrogen. The optical density was measured in a large exposed region of the polymer layer of the treated article. The intermediate article was then immersed in the aqueous-based electroless copper bath C1 for 3 minutes at 20° C., washed in distilled water for 4 minutes, and then dried with compressed nitrogen. The optical density was re-measured in the same large exposed region. The resulting product article exhibited high conductivity in both large exposed regions and fine exposed lines that were 5 to 6 μm in width. Non-exposed regions were clear and did not contain conductive copper. The results are summarized below in TABLE IV.

Comparison Example 7

Polymer B was dissolved in tetrahydrofuran solvent to 15% solids as described above and 3.3 g of this polymer solution was added to 1.7 g of tetrahydrofuran. The resulting reactive composition was spin coated onto a PET substrate to form a precursor article. The resulting precursor article was exposed through a mask to an Oriel high intensity UV lamp for 600 seconds. The exposed precursor article was then immersed in a 0.4 molar silver nitrate bath for 3 minutes, rinsed in distilled water for 2 minutes, immersed in a 1.0 weight % sodium oxalate bath for 5 minutes, rinsed in distilled water for 2 minutes, and then dried with compressed nitrogen. The optical density was measured in a large exposed region of the polymeric layer of the treated article. The intermediate article was then immersed in the aqueous electroless copper bath C1 for 3 minutes at 20° C., washed in distilled water for 4 minutes, and then dried with compressed nitrogen. The optical density was re-measured in the same large exposed region. The resulting product article exhibited no conductivity in both large exposed regions and fine exposed lines that were 5 to 6 μm in width. The results are summarized below in TABLE IV.

Comparison Example 8

Polymer J was dissolved in dichloromethane solvent to 15% solids as described above and 3.3 g of this Polymer J solution was added to 1.7 g of cyclopentanone. The resulting reactive composition was spin coated onto PET substrate to form a precursor article. The resulting precursor article was exposed through a mask to an Oriel high intensity UV lamp for 600 seconds. The exposed precursor article was then immersed in a 0.4 molar silver nitrate bath for 3 minutes, rinsed in distilled water for 2 minutes, immersed in a 1.0 weight % sodium oxalate bath for 5 minutes, rinsed in distilled water for 2 minutes, and then dried with compressed nitrogen. The optical density was measured in a large exposed region of the polymeric layer in the treated article. The intermediate article was then immersed in the aqueous-based electroless copper bath C1 for 3 minutes at 20° C., washed in distilled water for 4 minutes, and then dried with compressed nitrogen. The optical density was re-measured in the same large exposed region. The resulting product article exhibited no conductivity in both large exposed regions and fine exposed lines that were 5 to 6 μm in width. The results are summarized below in TABLE IV.

Invention Example 4

Polymer K was dissolved in dichloromethane solvent to 15% solids as described above and 3.3 g of this polymer solution was added to 1.7 g of cyclopentanone. The resulting reactive composition was spin coated onto a PET substrate to form a precursor article. The resulting precursor article was exposed through a mask to an Oriel high intensity UV lamp for 600 seconds. The exposed precursor article was then immersed in a 0.4 molar silver nitrate bath for 3 minutes, rinsed in distilled water for 2 minutes, immersed in a 1.0 weight % potassium oxalate bath for 5 minutes, rinsed in distilled water for 2 minutes, and then dried with compressed nitrogen. The optical density was measured in a large exposed region of the polymeric layer in the treated article. The intermediate article was then immersed in the aqueous-based electroless copper bath C1 for 3 minutes at 20° C., washed in distilled water for 4 minutes, and then dried with compressed nitrogen. The optical density was re-measured in the same large exposed region. The resulting product article exhibited high conductivity in both large exposed regions and fine exposed lines that were 5 to 6 µm in width. Non-exposed regions were clear and did not contain conductive copper. The results are summarized below in TABLE IV.

TABLE IV

| Example | Reactive Polymer | Pre-Copper Plating density | Post-Copper Plating density | Exposed Regions |
|---|---|---|---|---|
| Comparative 3 | A | 0.06 | 0.06 | nonconductive |
| Comparative 4 | B | 0.03 | 0.03 | nonconductive |
| Comparative 5 | J | 0.10 | 0.10 | nonconductive |
| Comparative 6 | K | 0.04 | 0.04 | nonconductive |
| Invention 3 | A | 0.07 | 3.31 | conductive |
| Comparative 7 | B | 0.04 | 0.04 | nonconductive |
| Comparative 8 | J | 0.03 | 0.06 | nonconductive |
| Invention 4 | K | 0.04 | 2.67 | conductive |

The results in TABLE IV show that the crosslinkable recurring units in the inventive reactive polymer must be present for the polymeric layer to produce an acceptable conductive pattern or image that survives the various aqueous-based processing solutions used in the method of this invention. The recurring units comprising ion exchange sulfonic acid groups must also be greater than 20 mol % of the total amount of recurring units present in the inventive reactive polymer to form a desirable conductive image.

In addition, the results also show that the electroless silver salt nuclei (electroless seed metal compound) produced with a very high $pK_{sp}$ (silver sulfide, $pK_{sp}$=49.2) were not capable of being amplified by the aqueous-based electroless plating bath (Comparative Examples 3-6) while the electroless silver salt nuclei (electroless seed metal compound) produced with a lower $pK_{sp}$ (silver oxalate, $pK_{sp}$=11.3) were capable of being amplified by the aqueous-based electroless plating bath when the recurring unit molar ratios are also correct (Invention Examples 3 and 4). The electroless silver hydroxide nuclei produced in Invention Examples 1-2 and Comparative Examples 1-2 had a $pK_{sp}$ of 7.7.

The invention has been described in detail with particular reference to certain preferred embodiments thereof, but it will be understood that variations and modifications can be effected within the spirit and scope of the invention.

The invention claimed is:

1. A method for forming a pattern in a polymeric layer, the method comprising:
   providing a polymeric layer comprising a reactive composition that comprises a reactive polymer that comprises: a polymer backbone, (1) pendant labile groups that are connected to the polymer backbone and the pendant labile groups being capable of being deblocked to provide pendant sulfonic acid groups upon exposure of the reactive polymer to radiation having a $\lambda_{max}$ of at least 150 nm and up to and including 450 nm, and (2) pendant groups that are connected to the polymer backbone, which pendant groups are capable of reacting in the presence of the pendant sulfonic acid groups to provide crosslinking in the reactive polymer,
   patternwise exposing the polymeric layer to radiation having a $\lambda_{max}$ of at least 150 nm and up to and including 450 nm, to provide a polymeric layer comprising non-exposed regions comprising the reactive composition and reactive polymer and exposed regions comprising a deblocked and crosslinked polymer,
   removing the reactive composition in the non-exposed regions,
   contacting the exposed regions of the polymeric layer comprising the deblocked and crosslinked polymer with electroless seed metal ions to form a pattern of electroless seed metal ions coordinated within the exposed regions,
   contacting the pattern of coordinate electroless seed metal ions in the exposed regions of the polymeric layer with a non-reducing reagent that reacts with the coordinated electroless seed metal ions to form a bound electroless seed metal compound that has a $pK_{sp}$ of less than 40, and
   electrolessly plating the bound metal electroless seed metal compound in the exposed regions of the polymeric layer with a metal that is the same as or different from the metal that is within the bound electroless seed metal compound.

2. The method of claim 1, wherein the reactive polymer comprises at least -A- and -B- recurring units, arranged randomly along the polymer backbone, wherein:
   the -A- recurring units comprise pendant aromatic sulfonic acid oxime ester groups, which recurring units are capable of providing pendant aromatic sulfonic acid groups upon irradiation with radiation having a $\lambda_{max}$ of at least 150 nm and up to and including 450 nm, the -A- recurring units being present in the reactive polymer in an amount of at least 25 mol % and up to and including 98 mol % based on total reactive polymer recurring units, and
   the -B- recurring units comprise pendant groups that can provide crosslinking upon generation of the pendant aromatic sulfonic acid groups in the -A- recurring units, the -B- recurring units being present in an amount of at least 2 mol % and up to and including 75 mol % based on total reactive polymer recurring units.

3. The method of claim 2, wherein the -A- recurring units are present in the reactive polymer in an amount of at least 40 mol % and up to and including 95 mol % based on total reactive polymer recurring units, and the -B- recurring units are present in the reactive polymer in an amount of at least 5 mol % and up to and including 60 mol % based on total reactive polymer recurring units.

4. The method of claim 2, wherein the -A- recurring units are present in the reactive polymer in an amount of at least 60 mol % and up to and including 95 mol % based on total reactive polymer recurring units, and the -B- recurring units are present in the reactive polymer in an amount of at least 5 mol % and up to and including 40 mol % based on total reactive polymer recurring units.

5. The method of claim 2, wherein the -B- recurring units comprise pendant crosslinking epoxy groups.

6. The method of claim 2, wherein the reactive polymer further comprises one or more additional recurring units that are different from all -A- and -B- recurring units.

7. The method of claim 6, wherein the reactive polymer further comprises one or more additional recurring units that are derived from one or more ethylenically unsaturated polymerizable monomers selected from the group consisting of alkyl acrylates, alkyl methacrylates, (meth)acrylamides, vinyl esters, (meth)acrylonitrile, maleic anhydrides, maleic imides, and styrene and styrene derivatives.

8. The method of claim 6, wherein the one or more additional recurring units are present in an amount of at least 1 mol % and up to and including 25 mol % based on the total reactive polymer recurring units.

9. The method of claim 1, wherein the reactive polymer comprises at least 50 weight % and up to and including 100 weight % of the total dry weight of the polymeric layer.

10. The method of claim 1, wherein the electroless seed metal ions are selected from the group consisting of silver ions, platinum ions, palladium ions, gold ions, tin ions, rhodium ions, iridium ions, nickel ions, and copper ions.

11. The method of claim 1, wherein the electroless seed metal ions are provided as a metal salt or metal-ligand complex.

12. The method of claim 1, comprising electrolessly plating with a metal that is selected from the group consisting of copper(II), silver(I), gold(IV), palladium(II), platinum(II), nickel(II), chromium(II), and combinations thereof.

13. The method of claim 1, comprising providing the polymeric layer on a substrate.

14. The method of claim 1, comprising patternwise exposing the polymeric layer to radiation having a $\lambda_{max}$ of at least 150 nm and up to and including 330 nm.

15. The method of claim 1, wherein the electroless seed metal compound has a $pK_{sp}$ of least 4 and less than 40.

16. The method of claim 1, wherein the non-reducing agent is a hydroxide, thiosulfate, carboxylate, or a combination thereof.

17. An intermediate article comprising a substrate and having disposed thereon a polymeric layer comprising exposed regions and non-exposed regions, the exposed regions comprising an electroless seed metal compound comprising a non-reducing reagent in a deblocked and crosslinked polymer derived from a reactive polymer that comprises: a polymer backbone, (1) pendant labile groups that are connected to the polymer backbone and are capable of being deblocked to provide pendant sulfonic acid groups upon exposure of the reactive polymer to radiation having a $\lambda_{max}$ of at least 150 nm and up to and including 450 nm, and (2) pendant groups that are connected to the polymer backbone and are capable of reacting in the presence of the pendant sulfonic acid groups to provide crosslinking in the reactive polymer, wherein the electroless seed metal compound has a $pK_{sp}$ of less than 40, and the non-exposed regions comprising the reactive polymer.

* * * * *